United States Patent
Wang et al.

(10) Patent No.: US 7,214,297 B2
(45) Date of Patent: May 8, 2007

(54) SUBSTRATE SUPPORT ELEMENT FOR AN ELECTROCHEMICAL PLATING CELL

(75) Inventors: You Wang, Cupertino, CA (US); Anzhong Chang, San Jose, CA (US); John O. Dukovic, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 403 days.

(21) Appl. No.: 10/879,668

(22) Filed: Jun. 28, 2004

(65) Prior Publication Data

US 2005/0284755 A1     Dec. 29, 2005

(51) Int. Cl.
C25B 9/02     (2006.01)

(52) U.S. Cl. .............. 204/297.01; 204/297.06; 204/297.07; 204/297.08; 204/297.09; 204/286.1; 204/287; 204/288; 204/279

(58) Field of Classification Search .......... 204/297.07, 204/297.08, 297.09, 297.1, 279, 286.1, 287, 204/288, 297.01
See application file for complete search history.

(56) References Cited

U.S. PATENT DOCUMENTS

| | | | |
|---|---|---|---|
| 4,466,864 A | 8/1984 | Bacon et al. | |
| 5,620,581 A | 4/1997 | Ang | |
| 5,744,019 A | 4/1998 | Ang | |
| 5,820,581 A | 10/1998 | Wolfinbarger, Jr. | |
| 5,883,762 A | 3/1999 | Calhoun et al. | |
| 5,972,192 A | 10/1999 | Dubin et al. | |
| 6,004,440 A | 12/1999 | Hanson et al. | |
| 6,027,631 A | 2/2000 | Broadbent | |
| 6,071,388 A | 6/2000 | Uzoh | |
| 6,080,289 A | 6/2000 | Plamatier et al. | |
| 6,080,291 A | 6/2000 | Woodruff et al. | |
| 6,090,711 A | 7/2000 | Batz, Jr. et al. | |
| 6,126,798 A | 10/2000 | Reid et al. | |
| 6,139,703 A | 10/2000 | Hanson et al. | |
| 6,149,781 A | 11/2000 | Forand | |
| 6,179,983 B1 | 1/2001 | Reid et al. | |
| 6,197,181 B1 | 3/2001 | Chen | |
| 6,228,231 B1 | 5/2001 | Uzoh | |
| 6,231,743 B1 | 5/2001 | Etherington | |
| 6,248,222 B1 | 6/2001 | Wang | |
| 6,261,433 B1 | 7/2001 | Landau | |
| 6,270,647 B1 | 8/2001 | Graham et al. | |
| 6,277,263 B1 | 8/2001 | Chen | |
| 6,290,833 B1 | 9/2001 | Chen | |
| 6,322,674 B1 | 11/2001 | Berner et al. | |
| 6,343,793 B1 | 2/2002 | Patton et al. | |
| 6,391,166 B1 | 5/2002 | Wang | |
| 6,395,152 B1 | 5/2002 | Wang | |

(Continued)

FOREIGN PATENT DOCUMENTS

WO     WO 99/47731     9/1999

(Continued)

*Primary Examiner*—Bruce F. Bell
(74) *Attorney, Agent, or Firm*—Patterson & Sheridan, LLP

(57) ABSTRACT

A contact ring for an electrochemical plating system is provided. The contact ring includes an annular substrate supporting member, a plurality of radially positioned conductive substrate contact pins extending from the substrate supporting member, an annular conductive thief element attached to the substrate supporting member, and at least one source of electrical power in electrical communication with the contact pins and the conductive thief element.

16 Claims, 6 Drawing Sheets

U.S. PATENT DOCUMENTS

| | | |
|---|---|---|
| 6,436,249 B1 * | 8/2002 | Patton et al. ............... 204/212 |
| 6,440,295 B1 | 8/2002 | Wang |
| 6,482,307 B2 | 11/2002 | Ashjaee et al. |
| 6,497,800 B1 | 12/2002 | Talieh et al. |
| 6,497,801 B1 | 12/2002 | Woodruff et al. |
| 6,527,920 B1 | 3/2003 | Mayer et al. |
| 6,547,937 B1 | 4/2003 | Oberlitner et al. |
| 6,551,483 B1 | 4/2003 | Mayer et al. |
| 6,565,729 B2 | 5/2003 | Chen et al. |
| 6,569,299 B1 | 5/2003 | Reid et al. |
| 6,569,927 B1 | 5/2003 | Gelbin |
| 6,570,886 B1 | 5/2003 | De Groote et al. |
| 6,589,401 B1 | 7/2003 | Patton et al. |
| 6,627,051 B2 * | 9/2003 | Berner et al. ............... 204/222 |
| 6,632,345 B1 | 10/2003 | Chen |
| 6,638,410 B2 | 10/2003 | Chen et al. |
| 6,660,137 B2 | 12/2003 | Wilson et al. |
| 6,669,883 B1 | 12/2003 | Rosenberg et al. |
| 2001/0042689 A1 | 11/2001 | Chen |
| 2003/0062258 A1 | 4/2003 | Woodruff et al. |
| 2003/0079995 A1 | 5/2003 | Contolini et al. |
| 2003/0102210 A1 | 6/2003 | Woodruff et al. |
| 2003/0141194 A1 | 7/2003 | Chen |
| 2003/0159921 A1 | 8/2003 | Harris et al. |
| 2003/0193896 A1 | 10/2003 | De Groote et al. |
| 2004/0031693 A1 | 2/2004 | Chen et al. |
| 2004/0035708 A1 | 2/2004 | Chen et al. |
| 2004/0035710 A1 | 2/2004 | Chen et al. |
| 2004/0040857 A1 | 3/2004 | Chen et al. |

FOREIGN PATENT DOCUMENTS

| | | |
|---|---|---|
| WO | WO 00/61498 | 10/2000 |
| WO | WO 02/45476 A2 | 6/2002 |

* cited by examiner

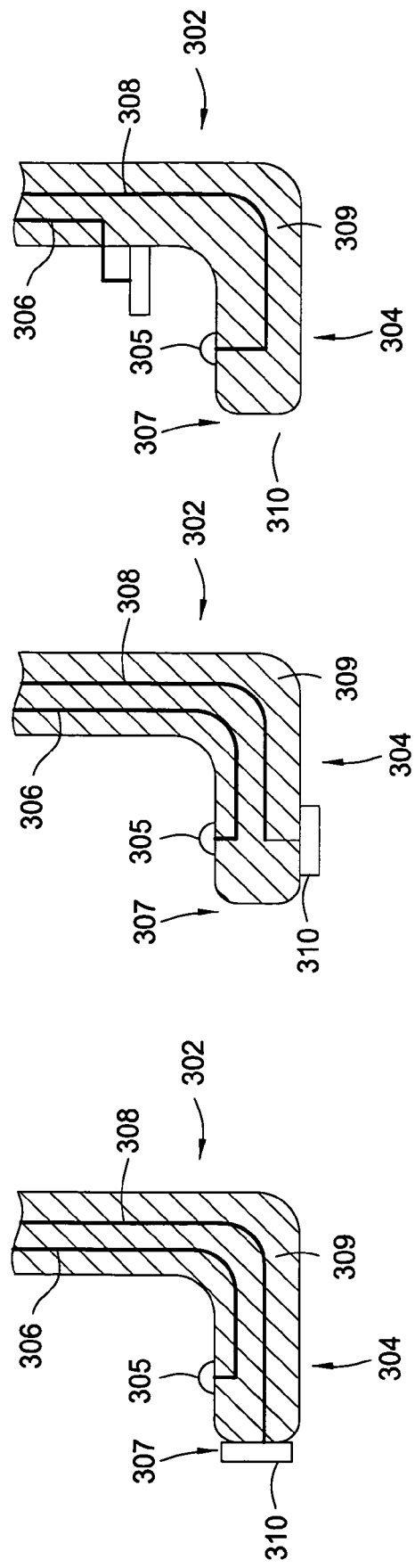

SUBSTRATE SUPPORT ELEMENT FOR AN ELECTROCHEMICAL PLATING CELL

BACKGROUND OF THE INVENTION

1. Field of the Invention

Embodiments of the invention are related to an apparatus and method for adjusting the current density near the perimeter of a substrate during a plating process.

2. Description of the Related Art

Metallization of high aspect ratio 90 nm and smaller sized features is a foundational technology for future generations of integrated circuit manufacturing processes. Metallization of these features is generally accomplished via an electrochemical plating process. However, electrochemical plating of these features presents several challenges to conventional gap fill methods and apparatuses. One such problem, for example, is that electrochemical plating processes generally require a conductive seed layer to be deposited onto the features to support the subsequent plating process. Conventionally, these seed layers have had a thickness of between about 1000 Å and about 2500 Å; however, as a result of the high aspect ratios of 90 nm features, seed layer thicknesses must be reduced to less than about 500 Å. This reduction in the seed layer thickness has been shown to cause a "terminal effect", which is generally understood to be an increase in the deposition thickness of an electrochemical plating (ECP) process as a result of the current density across the surface of the substrate decreasing as the distance from the electrical contacts toward the center of the substrate increases. The impact of the decreased current density nearer the center of the substrate is that the deposition thickness near the perimeter of the substrate is substantially greater than the deposition thickness nearer the center of the substrate.

The increase in deposition thickness near the perimeter of the substrate as a result of the terminal effect presents challenges to subsequent processes, e.g., polishing, bevel cleaning, etc., and as such, minimization of the terminal effect is desired. Conventional plating apparatuses and process have attempted to overcome the terminal effect through various apparatuses and methods. For example, conventional plating cells have been modified to include active thief electrodes positioned in the wall of the plating cell. These configurations were generally unsuccessful in controlling the terminal effect as a result of their lack of proximity to the perimeter of the substrate, which resulted poor control over the deposition thickness near the perimeter. Additionally, conventional configurations have also been modified to include passive shield or flange members configured to control the terminal effect. However, these configurations were also unsuccessful, as they were generally ineffective in controlling deposition thickness near the perimeter of the substrate.

Therefore, there exists a need for an apparatus and method for adjusting the current density near the perimeter of a substrate during a plating process to overcome the terminal effect generated by thin seed layers in electrochemical plating processes.

SUMMARY OF THE INVENTION

Embodiments of the invention generally provide a semiconductor processing apparatus and method configured to minimize the terminal effect. The apparatus of the invention includes a substrate contact ring having a thief electrode incorporated onto the contact ring. The method of the invention includes controlling the current density near the perimeter of the substrate via active control over a thief electrode positioned on a substrate contact ring proximate the perimeter of the substrate.

Embodiments of the invention may further provide a contact ring for an electrochemical plating system. The contact ring includes an annular substrate supporting member, a plurality of radially positioned conductive substrate contact pins extending from the substrate supporting member, an annular conductive thief element attached to the substrate supporting member, and at least one source of electrical power in electrical communication with the contact pins and the conductive thief element.

Embodiments of the invention may further provide an apparatus for supporting a substrate during an electrochemical plating process. The apparatus includes an annular substrate support member having an electrically insulative outer surface, a plurality of radially positioned conductive substrate contact elements extending from the support member, an annular conductive thief member attached to the support member, and at least one power supply in electrical communication with the substrate contact elements and the thief member.

Embodiments of the invention may further provide a contact ring for an electrochemical plating system. The contact ring includes an upper ring element configured to attach to a head assembly, a lower ring element configured to support a substrate thereon for an electrochemical plating process, a plurality of vertical support members connecting the upper ring to the lower ring, a plurality of electrically conductive contact pins radially positioned on the lower ring element, a conductive thief member positioned on the lower ring element, and a power supply in electrical communication with the thief member and the contact pins.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3B illustrates a sectional view of an exemplary contact ring of the invention.

FIG. 3C illustrates a sectional view of another exemplary contact ring of the invention.

FIG. 3D illustrates a sectional view of another exemplary contact ring of the invention.

DETAILED DESCRIPTION OF THE PREFERRED EMBODIMENT

Figure 1:
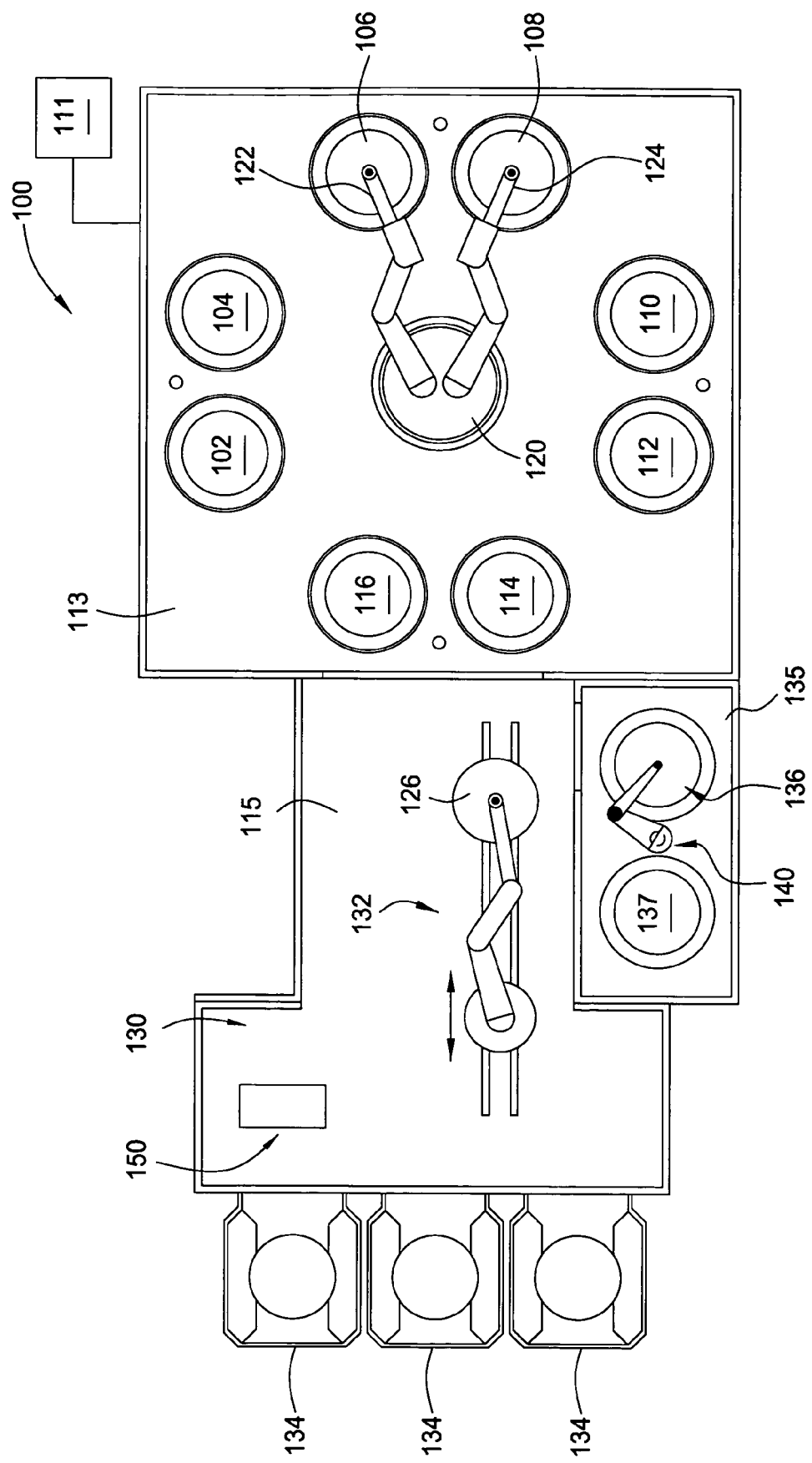
FIG. 1 illustrates a top plan view of one embodiment of an electrochemical plating system of the invention.

FIG. 1 illustrates a top plan view of an ECP system 100 of the invention. ECP system 100 includes a factory interface 130, which is also generally referred to as a substrate loading station. The factory interface 130 includes a plurality of substrate loading locations configured to interface with substrate containing cassettes 134. A robot 132 is positioned in the factory interface 130, and is configured to access the substrates contained in the cassettes 134. Further, robot 132 also extends into a link tunnel 115 that connects the factory interface 130 to a substrate processing mainframe or platform 113. The factory interface robot 132 generally includes the ability to rotate, extend, and vertically move an attached substrate support blade, while also allowing for linear travel along a robot track that extends from the factory interface 130 to the mainframe 113.

The position of the robot 132 allows the robot 132 to access substrate cassettes positioned on loading stations 134, and to then deliver the substrates to one of the processing cell locations at 114, 116 on the mainframe 113. Similarly, the robot 132 may be used to retrieve substrates from the processing locations 114, 116, or transfer substrates to or from an annealing chamber. After a substrate processing sequence is complete, robot 132 generally operates to return substrates to one of the cassettes 134 for removal from the ECP system 100. Additional configurations and implementations of an electrochemical processing system are illustrated in commonly assigned U.S. patent application Ser. No. 10/435,121 filed on Dec. 19, 2002 entitled "Multi-Chemistry Electrochemical Processing System", which is incorporated herein by reference in its entirety.

As mentioned above, the ECP system 100 also includes a processing mainframe 113. A substrate transfer robot 120 is generally centrally positioned on the mainframe 113, and includes one or more arms/blades 122, 124 configured to support and transfer substrates. Additionally, robot 120 and the accompanying arms 122, 124 are generally configured to extend, rotate about a central point, and vertically move, so that the robot 120 may insert and remove substrates from a plurality of processing locations 102, 104, 106, 108, 110, 112, 114, 116 positioned on the mainframe 113. Generally, processing locations 102, 104, 106, 108, 110, 112, 114, 116 may be any number of processing cells utilized in an electrochemical plating process, e.g., electrochemical plating cells, rinsing cells, bevel clean cells, spin rinse dry cells, substrate surface cleaning cells, electroless plating cells, metrology inspection stations, and/or other processing cells that may be beneficially used in conjunction with a plating process. Each of the respective processing stations and robots are generally in communication with a process controller 111, which may be a microprocessor-based control system configured to receive inputs from both a user and/or various sensors positioned on the system 100 and appropriately control the operation of the system 100 in accordance with the inputs and/or a predetermined control sequence.

Figure 2:
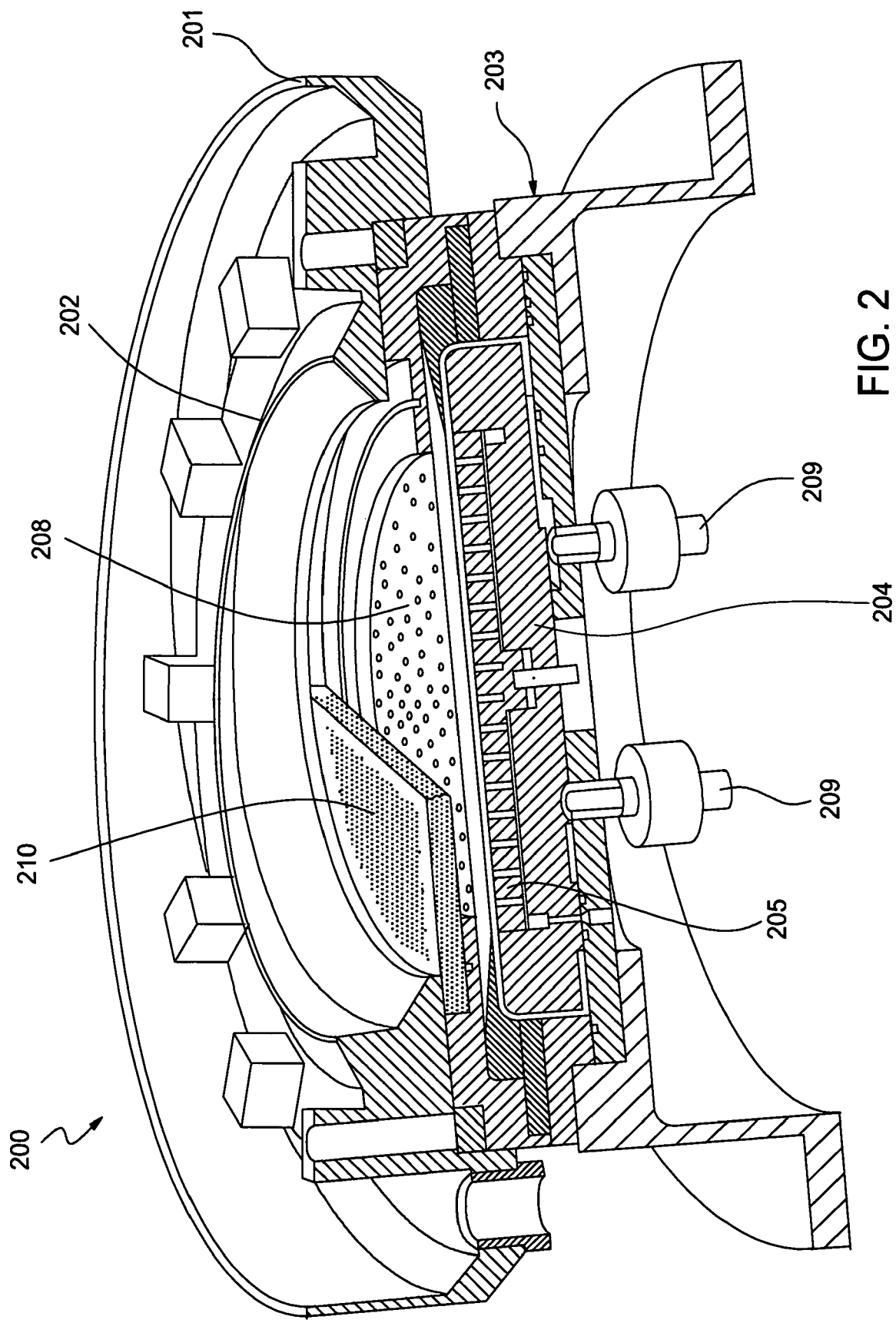
FIG. 2 illustrates an exemplary plating cell of the invention.

FIG. 2 illustrates a partial perspective and sectional view of an exemplary plating cell 200 that may be implemented at any one of the processing locations noted above. The electrochemical plating cell 200 generally includes an outer basin 201 and an inner basin 202 positioned within outer basin 201. The inner basin 202 is generally configured to contain a plating solution that is used to plate a metal, e.g., copper, onto a substrate during an electrochemical plating process. During the plating process, the plating solution is generally continuously supplied to inner basin 202, and as such, the solution continually overflows the uppermost point (generally termed a "weir") of the inner basin 202, and is collected by an outer basin 201. The plating solution is then drained and collected for chemical management and/or recirculation. The frame member 203 of plating cell 200 supports an annular base member 204 on an upper portion thereof. Since frame member 203 is generally elevated on one side, the upper surface of base member 204 is generally tilted from horizontal at an angle that corresponds to the angle of frame member 203 relative to a horizontal position. Base member 204 includes an annular or disk shaped recess formed into a central portion thereof, the annular recess being configured to receive a disk shaped anode member 205 positioned below a diffusion member 210. Base member 204 further includes a plurality of fluid inlets/drains 209 extending from a lower surface thereof. Each of the fluid inlets/drains 209 are generally configured to individually supply or drain a fluid to or from either the anode compartment or the cathode compartment of plating cell 200. Further details of the exemplary plating cell are further illustrated in commonly assigned U.S. patent application Ser. No. 10/268,284, which was filed on Oct. 9, 2002 under the title "Electrochemical Processing Cell", claiming priority to U.S. Provisional Application Ser. No. 60/398,345, which was filed on Jul. 24, 2002, both of which are incorporated herein by reference in their entireties. Additionally, the relationship between the contact ring and the plating cell may be found in commonly assigned U.S. patent application Ser. No. 10/781,040, which was filed on Feb. 18, 2004 under the title "Method for Immersing a Substrate", which is incorporated by reference in its entirety.

Figure 3A:
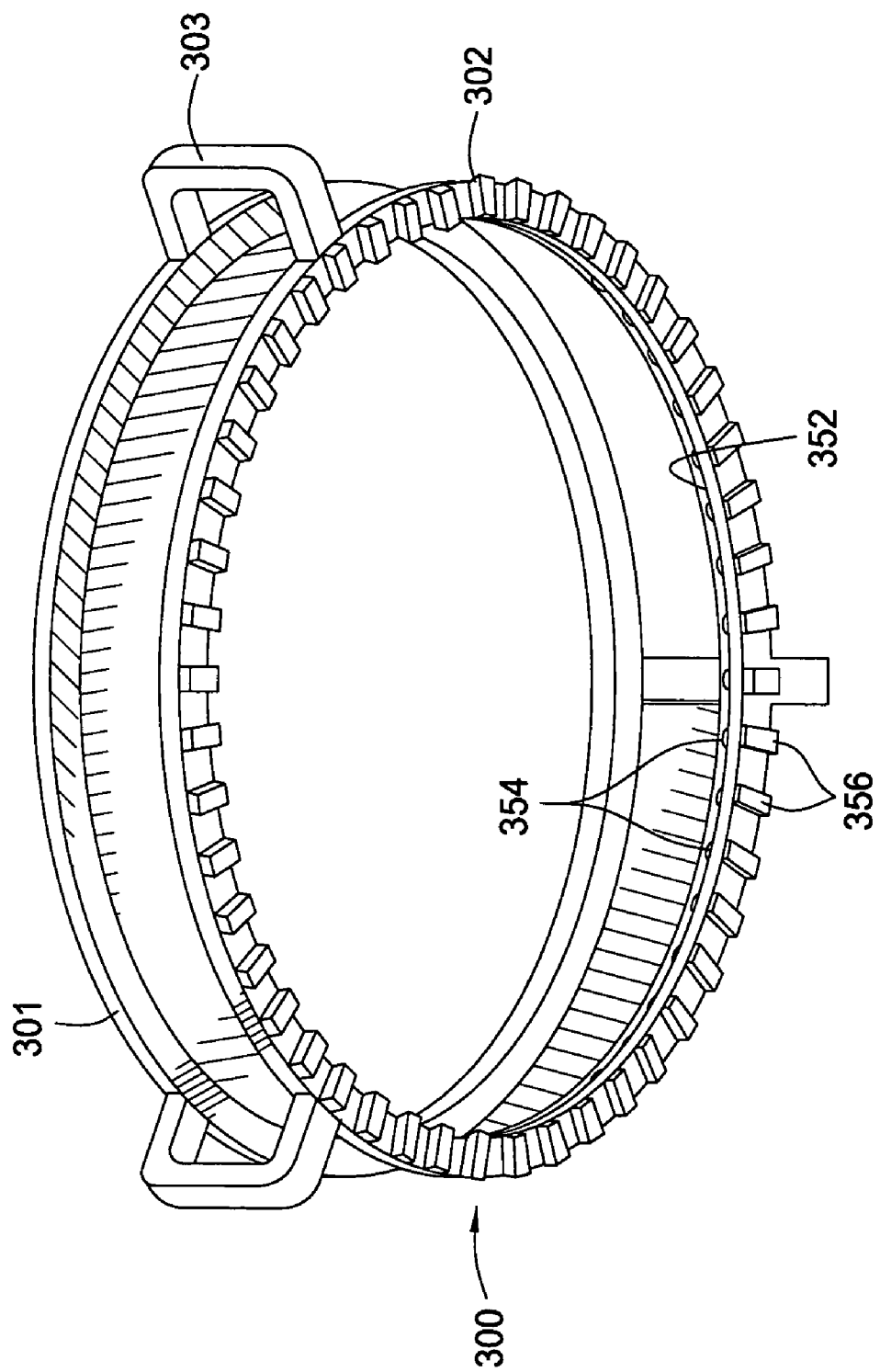
FIG. 3A illustrates a perspective view of an exemplary contact ring of the invention.

FIG. 3A illustrates a perspective view of an exemplary contact ring 300 of the invention. Contact ring 300 generally includes an upper annular member 301, a lower substrate supporting member 302, and at least one support post member 303 connecting the upper annular member 301 to the lower substrate support member 302. The upper annular member 301 is generally configured to secure the contact ring 300 to a head assembly (not shown) that is configured to selectively position and rotate contact ring 300 during substrate processing. The lower substrate supporting member 302 is generally configured to receive and support a substrate (not shown) thereon for processing. Additionally, the supporting member 302 is also configured to electrically contact the substrate to provide an electrical processing bias thereto.

FIG. 3B illustrates a sectional view of the lower substrate supporting member 302 of the exemplary contact ring 300 of the invention. The lower substrate supporting member 302 generally includes a plurality of electrically conductive contact pins 305 positioned thereon. The contact pins 305 are generally radially positioned around the lower substrate supporting member 302, extend vertically from the supporting member 302, and have substantially coplanar terminating ends configured to cooperatively support a substrate. Each of pins 305 is also in electrical communication with a first electrical supply line 306, which is selectively in electrical communication with a cathodic terminal of a power supply (not shown). Lower substrate supporting member 302 further includes an active thief member 307 positioned radially inward of the contact pins 305. The active thief 307 generally includes an electrically conductive member in electrical communication with a second electrical supply line 308, which is generally in electrical communication with a cathodic terminal of a power supply (not shown). The outer surfaces of ring 300, which includes lower substrate supporting member 302, generally includes a electrically insulative coating. As such, the only exposed conductive portions of contact ring 300 are the contact pins 305 and the active thief 307.

Active thief 307 may include a continuous conductive ring member positioned on the contact ring 300. Thief 307 may be positioned vertically, as shown in FIG. 3B, horizontally, as shown in FIGS. 3C and 3D, or at an angle (not shown). Active thief 307 may alternatively include a plurality of radially positioned conductive segments. The plurality of conductive segments may be arranged such that each segment corresponds to and is positioned radially inward of a contact pin 305. In this configuration, each segment is generally configured to reduce the terminal effect that occurs proximate each pin. Regardless of the orientation of thief member 307, the thief includes an exposed thief surface 310. Surface 310 generally includes the surface of thief 307 with the most exposed surface area, e.g., the vertical surface 310 of FIG. 3B, or the horizontal surface of the thief elements illustrated in FIGS. 3C and 3D. The active thief 307 is generally manufactured from a noble metal, or another metal that is generally non-reactive with electrochemical plating solutions. Exemplary materials include platinum, titanium, and stainless steel.

Both active thief 307 and contact pins 305 are in communication with a power supply (not shown). A common power supply may be used to provide electrical power to pins 305 and active thief 307, or alternatively, multiple power supplies may be used to independently provide electrical power to the pins 305 and the active thief 307. A controller, such as system controller 111, may be used to control or regulate the application of power to the pins 305 and the active thief 307, and as such, the ratio of power applied between the respective elements may be controlled. The power distribution to the pins 305 and the thief 307 may be controlled via a power distribution network, which may, for example, include a variable resistor that is controlled by the system controller 111 to vary the current supplied to each of the active thief 307 and pins 305. However, other known means of controlling power application between two electrical elements are also within the scope of the invention.

As noted above, the active thief 307 may be positioned horizontally. FIG. 3C illustrates a configuration where the active thief 307 is positioned on a lower surface of the contact ring 300. In this configuration, active thief 307, which may again be a continuous conductive ring or a plurality of conductive segments, is generally positioned below the contact pins 305, e.g., in a plane that is below the plane of the substrate being processed. In similar fashion to the contact ring 300 illustrated in FIG. 3B, the active thief 307 is in electrical communication with a source of controlled electrical power.

FIG. 3D illustrates another configuration of the contact ring 300 where the active thief 307 is positioned horizontally. In this embodiment, the active thief 307 is positioned radially outward of the substrate such that the lower surface of active thief 307 is substantially coplanar with the surface of the substrate S being plated. In similar fashion to the contact ring 300 illustrated in FIG. 3B, the active thief 307 is in electrical communication with a source of controlled electrical power.

In operation, embodiments of the invention are configured to minimize the terminal effect. More particularly, embodiments of the invention are configured to reduce the current density near the perimeter of the surface of the substrate being plated through selective activation of an active thief element. The active thief element, examples of which have been illustrated above in FIGS. 3B–3D, generally operates to receive electric field or flux, and since the active thief element is positioned on the contact ring proximate the perimeter of the substrate, the active thief element operates to reduce the field or flux near the perimeter of the substrate. Since the field or flux is proportional to the deposition rate, the reduction in field or flux operates to reduce the deposition thickness near the perimeter of the substrate, i.e., the reduction in field or flux operates to minimize the terminal effect.

Figure 4:
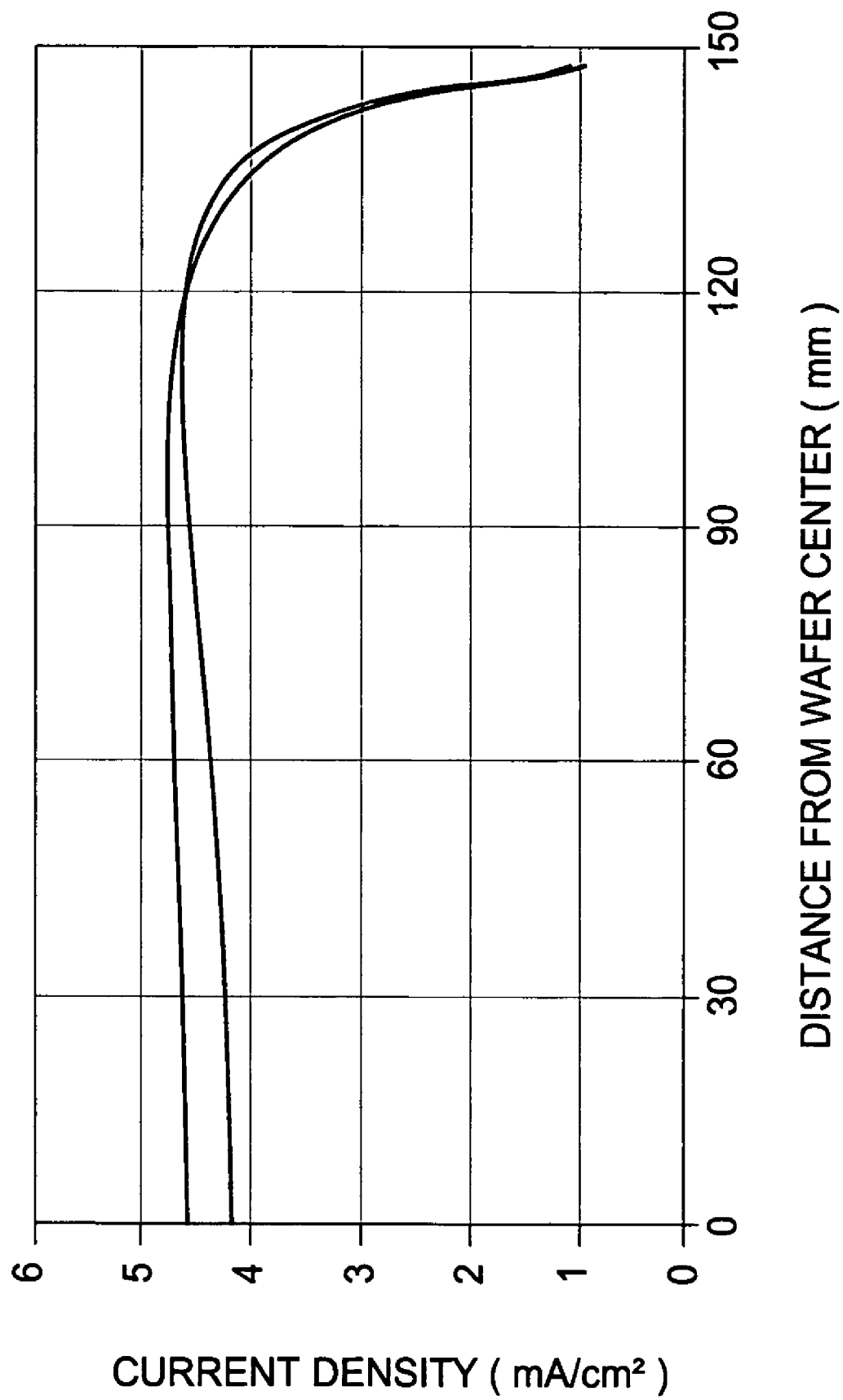
FIG. 4 illustrates a current density plot for a contact ring of the invention.
Figure 5:
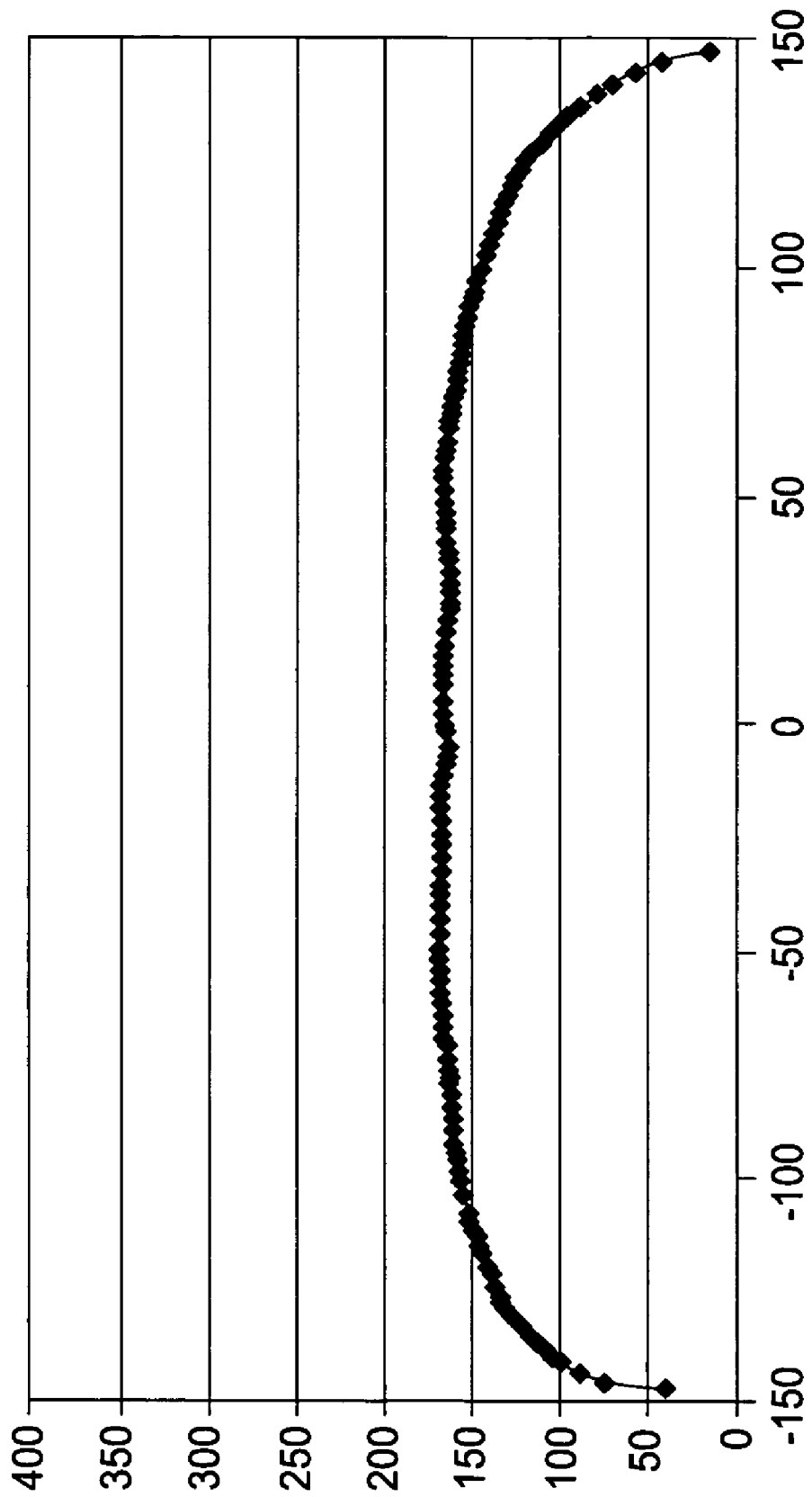
FIG. 5 illustrates a deposition thickness plot for a contact ring of the invention.

Additionally, embodiments of the invention provide a controllable active thief member. As such, the electrical bias supplied to the active thief (or the ratio of the bias supplied to the active thief and the contact pins) may be adjusted or tuned to achieve planar deposition with minimal increase in thickness near the perimeter of the substrate. FIG. 4 illustrates a current density plot for a contact ring of the invention. The plot of FIG. 4 illustrates that the active current thief of the invention may be used to substantially reduce the current density near the perimeter of the substrate. As such, the deposition thickness near the perimeter of the substrate may be actively controlled by adjusting the power supplied to the active thief, as illustrated by the substantial decrease in the current density near the edge of the substrate in FIG. 4 (the substrate tested had a diameter of 300 mm). Further, FIG. 5 illustrates a deposition thickness plot for a contact ring of the invention. The plot of FIG. 5 illustrates that the active current thief of the invention may be used to decrease the deposition thickness near the perimeter of the substrate.

The current density and resulting deposition thickness plots of FIGS. 4 and 5 result from the annular or ring shaped active thief member 307 absorbing electric flux near the perimeter of the substrate. This essentially results in the anode electrically seeing a substrate that has a larger surface area than the substrate being plated (as the ring physically and electrically operates to extend the perimeter of the substrate), and as such, the terminal effect is shifted to the active thief member 307 from the perimeter of the substrate, i.e., the increased thickness near the perimeter is shifted to the active thief and off or away from the perimeter of the substrate. Further, since the active thief member may be controlled, the deposition thickness near the perimeter of the substrate may also be controlled.

Once a substrate plating process has been completed, generally the active thief 307 will be deplated. However, the deplating process time for the active thief is generally not significantly longer than that required to deplate the contact pins 305. As such, deplating of the active thief element 307 does not have a significant impact on plating throughput, and in fact, the overall plating throughput may be reduced, as the bevel cleaning and polishing times for the substrate plated by the present invention will be reduced as a result of the decrease in perimeter deposition.

While the foregoing is directed to embodiments of the present invention, other and further embodiments of the invention may be devised without departing from the basic scope thereof, wherein the scope is determined by the claims that follow.

The invention claimed is:

1. A contact ring assembly for an electrochemical plating system, comprising:
   an annular substrate supporting member;
   a plurality of radially positioned conductive substrate contact pins extending from the substrate supporting member;
   an annular conductive thief element attached to the substrate supporting member; and
   at least one source of electrical power in electrical communication with the contact pins and the annular conductive thief element, wherein the annular conductive thief element comprises a plurality of conductive segments positioned to correspond with each of the plurality of substrate contact pins.

2. The contact ring assembly of claim 1, wherein the at least one source of electrical power comprises a first electrical connection in communication with the contact pins and a separate second electrical connection in communication with the annular conductive thief element.

3. The contact ring assembly of claim 2, further comprising a controller configured to independently control application of electrical power to the first and second electrical connections.

4. The contact ring assembly of claim 3, wherein the controller is configured to regulate a power distribution network in electrical communication with the first and second electrical connections.

5. The contact ring assembly of claim 1, wherein the annular conductive thief element comprises a ring shaped member having a horizontal thief surface that is in substantially the same plane as a substrate positioned on the contact pins and radially outward thereof.

6. The contact ring assembly of claim 1, wherein the annular conductive thief element comprises a ring shaped member having a vertical thief surface that is positioned radially inward of the contact pins.

7. The contact ring assembly of claim 1, wherein the annular conductive thief element comprises a ring shaped member positioned on a lower surface of the substrate supporting member and having a horizontal thief surface that is generally below the contact pins.

8. The contact ring assembly of claim 1, wherein the annular conductive thief element is positioned adjacent and substantially co planar with the contact pins.

9. An apparatus for supporting a substrate during an electrochemical plating process, comprising:
   an annular substrate support member having an electrically insulative outer surface;
   a plurality of radially positioned conductive substrate contact elements extending from the support member;
   an annular conductive thief member attached to the support member; and
   at least one power supply in electrical communication with the substrate contact elements and the thief member,
   wherein the thief member has a conductive band having a major surface exposed to the plating process, the thief member is attached to the support member such that the major surface is positioned perpendicular to a substrate surface positioned on the substrate contact members.

10. The apparatus of claim 9, wherein the thief member is in communication with a cathodic terminal of a first power supply and the contact elements are in communication with a cathodic terminal of a second power supply.

11. The apparatus of claim 9, further comprising an upper ring member attached to the annular substrate support member by a plurality of vertical support post members, the upper ring member being configured to engage a head assembly.

12. The apparatus of claim 11, wherein the upper ring member and the vertical support post members are configured to conduct electrical power to the annular substrate support member having the contact elements and thief element attached thereto.

13. The apparatus of claim 9, wherein the thief member comprises a plurality of conductive segments positioned to correspond with each of the plurality of substrate contact elements.

14. A contact ring assembly for an electrochemical plating system, comprising:
   an upper ring element configured to attach to a head assembly;
   a lower ring element configured to support a substrate thereon for an electrochemical plating process;
   a plurality of vertical support members connecting the upper ring element to the lower ring element;
   a plurality of electrically conductive contact pins radially positioned on the lower ring element;
   a conductive thief member positioned on the lower ring element; and
   a power supply in electrical communication with the thief member and the contact pins,
   wherein the thief member comprises a band shaped member having an exposed major surface positioned vertically.

15. The contact ring assembly of claim 14, wherein the band shaped member has a vertical surface that is positioned radially inward of a perimeter of a substrate positioned on the contact pins.

16. The apparatus of claim 14, wherein the thief member comprises a plurality of conductive segments positioned to correspond with each of the plurality of substrate contact pins.

* * * * *